(12) United States Patent
Fifield et al.

(10) Patent No.: US 9,093,165 B2
(45) Date of Patent: Jul. 28, 2015

(54) DISTRIBUTED CURRENT CLOCK FOR NANO-MAGNETIC ELEMENT ARRAY

(71) Applicant: International Business Machines Corporation, Armonk, NY (US)

(72) Inventors: John A. Fifield, Underhill, VT (US); Steven J. Kurtz, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 14/041,663

(22) Filed: Sep. 30, 2013

(65) Prior Publication Data

US 2015/0092478 A1    Apr. 2, 2015

(51) Int. Cl.
  *G11C 11/00*     (2006.01)
  *G11C 11/16*     (2006.01)
  *H03K 19/096*    (2006.01)

(52) U.S. Cl.
  CPC .......... *G11C 11/1693* (2013.01); *H03K 19/096* (2013.01)

(58) Field of Classification Search
  CPC ............... G11C 11/1693; G11C 11/02; G11C 11/1675; H03K 19/096
  USPC ...................... 365/171, 189.09; 977/838, 934
  See application file for complete search history.

(56) References Cited

U.S. PATENT DOCUMENTS

| | | | |
|---|---|---|---|
| 4,578,760 A | 3/1986 | Adams et al. | |
| 6,241,549 B1 | 6/2001 | Saka et al. | |
| 6,774,391 B1 | 8/2004 | Cowburn | |
| 7,054,185 B2 | 5/2006 | Theel | |
| 7,539,045 B2 | 5/2009 | Boeve | |
| 7,746,689 B2 * | 6/2010 | Hannah | 365/171 |
| 8,138,874 B1 * | 3/2012 | Carlton et al. | 335/306 |
| 8,184,476 B2 | 5/2012 | Nahas et al. | |
| 8,203,871 B2 | 6/2012 | Lou et al. | |
| 8,331,136 B2 * | 12/2012 | Ohmori et al. | 365/158 |
| 8,921,962 B2 * | 12/2014 | Atulasimha et al. | 257/431 |
| 2010/0321993 A1 | 12/2010 | Nikonov et al. | |
| 2012/0267735 A1 | 10/2012 | Atulasimha et al. | |

OTHER PUBLICATIONS

Alam, M., "Design, Fabrication and Modeling of Clocked Manomagnet Logic Circuit Elements," Thesis, Dissertations Abstracts International, vol. 7203B, 2010, 247 pages.

(Continued)

*Primary Examiner* — Tan T. Nguyen
(74) *Attorney, Agent, or Firm* — Gibb & Riley, LLC; David A. Cain, Esq.

(57) ABSTRACT

A nano-magnetic element array having a conductive line adjacent to a group of nano-magnetic elements and a multi-level current driver connected to an input node on the conductive line. The current driver is controlled by a pair of voltage clock signals and a voltage reference so as to selectively change the current amount at the input node between a first level that erases the state of the elements, a second level that switches the state of the elements and a third level that maintains the state of the elements. The current driver is further configured so that the transition from the second to the third level is gradual. Optionally, a bias generator can selectively adjust the voltage reference and thereby, the current amount at the input node. Also, optionally, the same voltage clock signal and voltage reference lines can be used to control multiple multi-level current drivers within the array.

20 Claims, 12 Drawing Sheets

(56) References Cited

OTHER PUBLICATIONS

Dingier, et al., "Making non-Volatile Nanomagnet Logic Non-Volatile," 21.1, DAC 2012, ACM 978-1-4503-1199-Jan. 12, 2006, 2012, pp. 476-485.

Kurtz, S., "Nanomagnet Logic: Architectures, Design, and Benchmarking," Graduate Program in Computer Science and Engineering, Dissertation, Apr. 2013, 231 pages.

* cited by examiner

DISTRIBUTED CURRENT CLOCK FOR NANO-MAGNETIC ELEMENT ARRAY

BACKGROUND

The present disclosure relates to nano-magnetic element arrays and, more particularly, to a nano-magnetic element array comprising multiple multi-level current drivers for selectively controlling the states (e.g., erase, switch and store) of multiple groups of nano-magnetic elements.

Recently, nano-magnetic elements have been incorporated into both memory arrays and logic arrays to provide significant energy savings as compared to conventional complementary metal oxide semiconductor (CMOS) memory or logic arrays. The nano-magnetic elements in such arrays are field-coupled and they require a pulsed magnetic field to alter their logical and/or conductive state. For example, in a typical nano-magnetic element array, groups of nano-magnetic elements are disposed in close proximity to a conductive line (also referred to herein as a current-clock line). Each group can comprise one or more nano-magnetic elements and each nano-magnetic element can comprise one or more nano-magnets. For example, each nano-magnetic element can comprise a row of evenly spaced nano-magnets. In any case, each nano-magnet can be responsive to a current pulse, which is applied to the conductive line by a clock circuit-controlled current driver. The current pulse creates a magnetic field, which causes the state and, particularly, the polarity of the adjacent nano-magnets in the nano-magnetic elements to switch. However, when the number and density of nano-magnetic elements in an array are high and the conductive line adjacent to these elements is long, the resistance-capacitance (RC) time constant of the conductive line can negatively impact the speed and physical functionality of the array. Therefore, there is a need in the art for an improved nano-magnetic element array that allows for greater speed and functionality.

SUMMARY

In view of the foregoing, disclosed herein are improved nano-magnetic element arrays (e.g., magneto-resistive random access memory (MRAM) arrays or logic arrays) that allow for greater speed and functionality. In each nano-magnetic element array, a conductive line can be positioned adjacent to a group of nano-magnetic elements and a multi-level current driver can be electrically connected to an input node on the conductive line. The multi-level current driver can receive a pair of voltage clock signals and at least one voltage reference and based thereon, can selectively change the amount of current applied at the input node between multiple different levels that the nano-magnetics are responsive to. For example, the multi-level current driver can selectively change the amount of current applied at the input node between a first level that erases the state of the elements, a second level that is less than the first level and that switches the state of the elements and a third or zero level that maintains the state of the elements. The multi-level current driver can further be configured so that the transition from the second level to the third level is gradual to prevent soft errors. The same pair of voltage clock signal lines and the same voltage reference line can be used to supply signals to other multi-level current drivers in the array. Optionally, the voltage reference can be supplied by a bias generator that is configured to allow the voltage reference and, thereby the amount of current flowing to the input node at the first and second levels to be selectively adjusted.

More particularly, disclosed herein is an improved nano-magnetic element array that allows for greater speed and functionality.

The nano-magnetic element array can comprise a first clock signal line, a second clock signal line, and a voltage reference line.

The nano-magnetic array can further comprise a first group of nano-magnetic elements and, optionally, a second group of nano-magnetic elements. Each first group can comprise one or more nano-magnetic elements and each second group can similarly comprise one or more nano-magnetic elements. The nano-magnetic elements in the first group and the second group can be either the same or different. In any case, each nano-magnetic element can comprise one or more nano-magnets. For example, each nano-magnetic element can comprise a row of evenly spaced nano-magnets.

The nano-magnetic element array can also comprise a conductive line. This conductive line can comprise a first segment adjacent to the first group of nano-magnetic elements and an input node at one end of the first segment. If the nano-magnetic element array also comprises a second group of nano-magnetic elements, the conductive line can comprise a second segment adjacent to the second group and connected to the first segment at the input node. Thus, when there are two segments in the conductive line, the input node will be at the center between the segments and, thereby between the two groups of nano-magnetic elements as opposed to at the end of the conductive line.

Finally, the nano-magnetic element array can comprise a multi-level current driver. This multi-level current driver can be electrically connected to the input node, the first voltage clock signal line, the second voltage clock signal line and the voltage reference line. This multi-level current driver can receive a first voltage clock signal on the first voltage clock signal line, a second voltage clock signal on the second voltage clock signal line and a voltage reference on the voltage reference line. Based on the first voltage clock signal, the second voltage clock signal and the voltage reference, the multi-level current driver can selectively change the amount of current applied to (i.e., flowing to) the input node between multiple different levels and the nano-magnetic elements can be responsive to these different levels. For example, the multi-level current driver can selectively change the amount of current applied to the input node between a first level, a second level and a third level. The first level can be a relatively high level so as to erase the state of the nano-magnetic elements. The second level can be less than first level and can switch the state of the nano-magnetic elements. The third level can be approximately zero so as to maintain the state of the nano-magnetic elements. The multi-level current driver can further be configured so that the transition from the second level to the third level is gradual to prevent soft errors.

Also disclosed herein is a nano-magnetic element array that specifically comprises a bias generator that generates the voltage reference on the voltage reference line and this bias generator can, optionally, be configured to allow the voltage reference to be selectively adjusted.

As described above, the nano-magnetic element array can comprise a first clock signal line, a second clock signal line, and a voltage reference line.

The nano-magnetic array can further comprise a first group of nano-magnetic elements and, optionally, a second group of nano-magnetic elements. Each first group can comprise one or more nano-magnetic elements and each second group can similarly comprise one or more nano-magnetic elements. The nano-magnetic elements in the first group and the second group can be either the same or different. In any case, each nano-magnetic element can comprise one or more nano-magnets. For example, each nano-magnetic element can comprise a row of evenly spaced nano-magnets.

The nano-magnetic element array can also comprise a conductive line. This conductive line can comprise a first segment adjacent to the first group of nano-magnetic elements and an input node at one end of the first segment. If the nano-magnetic element array also comprises a second group of nano-magnetic elements, the conductive line can comprise a second segment adjacent to the second group and connected to the first segment at the input node. Thus, when there are two segments in the conductive line, the input node will be at the center between the segments and, thereby between the two groups of nano-magnetic elements as opposed to at the end of the conductive line.

The nano-magnetic element array can also comprise a bias generator that generates a voltage reference on the voltage reference line.

Finally, the nano-magnetic element array can comprise a multi-level current driver. This multi-level current driver can be electrically connected to the input node, the first voltage clock signal line, the second voltage clock signal line and the voltage reference line. This multi-level current driver can receive a first voltage clock signal on the first voltage clock signal line, a second voltage clock signal on the second voltage clock signal line and the voltage reference on the voltage reference line (e.g., as supplied by the bias generator). Based on the first voltage clock signal, the second voltage clock signal and the voltage reference, the multi-level current driver can selectively change the amount of current applied to (i.e., flowing to) the input node between multiple different levels and the nano-magnetic elements can be responsive to these different levels. For example, the multi-level current driver can selectively change the amount of current applied to the input node between a first level, a second level and a third level. The first level can be a relatively high level so as to erase the state of the nano-magnetic elements. The second level can be less than first level and can switch the state of the nano-magnetic elements. The third level can be approximately zero so as to maintain the state of the nano-magnetic elements. The multi-level current driver can further be configured so that the transition from the second level to the third level is gradual to prevent soft errors.

Optionally, the bias generator can be configured so as to allow the voltage reference to be selectively adjusted and, thereby to allow the amount of current applied to the input node at each level and, particularly, at the first level and the second level to be selectively adjusted.

In each of the nano-magnetic element arrays described above the same pair of voltage clock signals and same voltage reference can be used to control not one, but multiple multi-level current drivers, within the array. Specifically, as described above, a nano-magnetic element array can comprise a first clock signal line, a second clock signal line, and a voltage reference line.

The nano-magnetic element array can further comprise a plurality of sections. Each section can comprise a first group of nano-magnetic elements and, optionally, a second group of nano-magnetic elements. Each of the nano-magnetic elements can comprise, for example, a row of evenly spaced nano-magnets. Each section can further comprise a conductive line. This conductive line can comprise a first segment adjacent to the first group and an input node at one end of the first segment. If the section also comprises a second group of nano-magnetic elements, the conductive line can comprise a second segment adjacent to the second group and connected to the first segment at the input node. Thus, when there are two segments in the conductive line in a given section, the input node will be at the center between the segments and, thereby between the two groups of nano-magnetic elements as opposed to at the end of the conductive line.

Each section can further comprise a multi-level current driver connected to the input node of the conductive line contained within that section and also connected to the first voltage clock signal line, the second voltage clock signal line and the voltage reference line. Each multi-level current driver can receive a first voltage clock signal on the first voltage clock signal line, a second voltage clock signal on the second voltage clock signal line and a voltage reference on the voltage reference line (e.g., as supplied by a bias generator). Based on the first voltage clock signal, the second voltage clock signal and the voltage reference, each multi-level current driver can selectively change the amount of current applied to (i.e., flowing to) the input node of the conductive line contained within its section between multiple different levels. For example, each multi-level current driver can selectively change the amount of current applied to the input node of the conductive line contained within its section between a first level, a second level and a third level. The first level can be a relatively high level so as to erase the state of the nano-magnetic elements. The second level can be less than first level and can switch the state of the nano-magnetic elements. The third level can be approximately zero so as to maintain the state of the nano-magnetic elements. The multi-level current driver can further be configured so that the transition from the second level to the third level is gradual to prevent soft errors.

BRIEF DESCRIPTION OF THE SEVERAL VIEWS OF THE DRAWINGS

The embodiments herein will be better understood from the following detailed description with reference to the drawings, which are not necessarily drawn to scale and in which.

DETAILED DESCRIPTION

Figure 1:
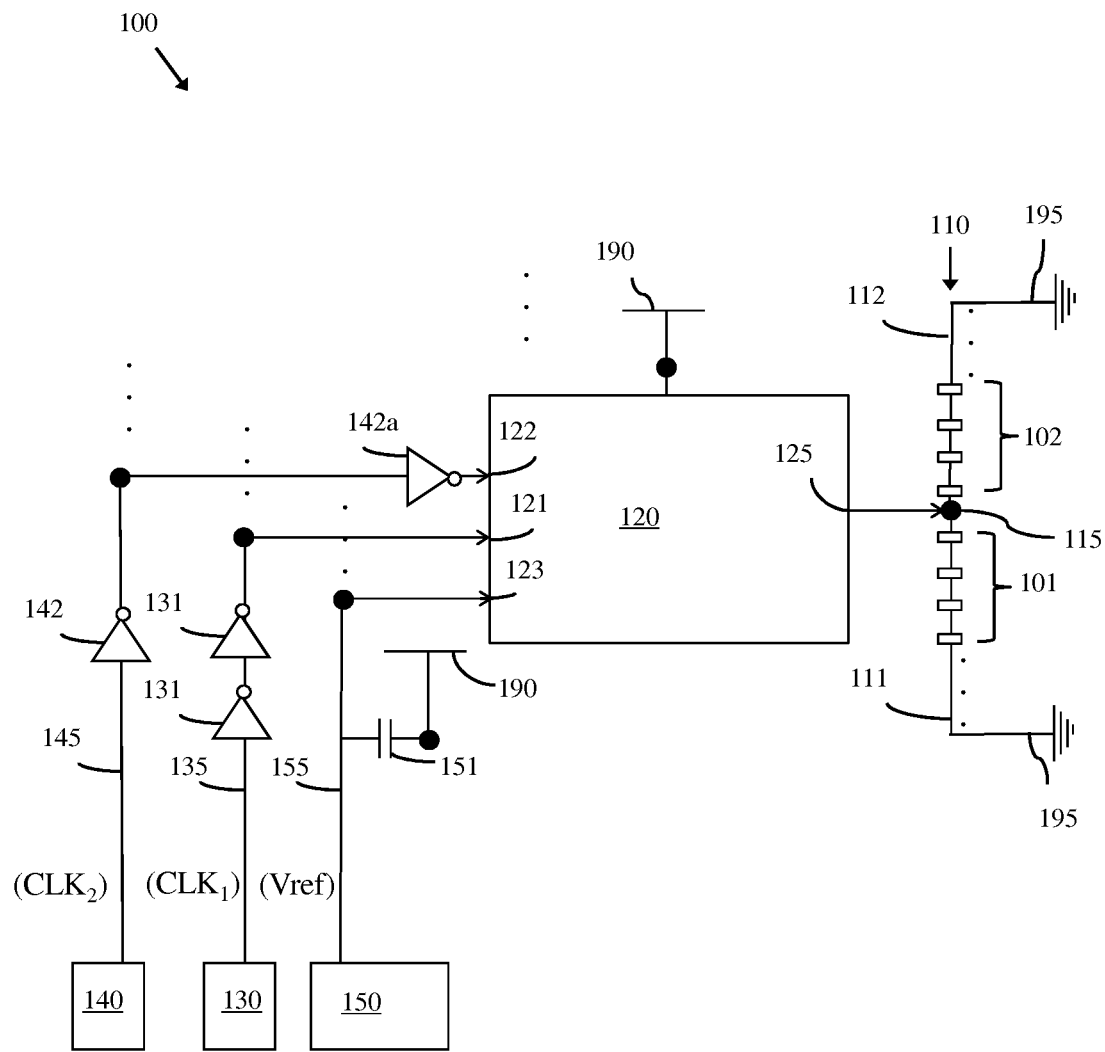
FIG. 1 is a schematic diagram illustrating a nano-magnetic element array.

As mentioned above, recently, nano-magnetic elements have been incorporated into both memory arrays and logic arrays to provide significant energy savings as compared to conventional complementary metal oxide semiconductor (CMOS) memory or logic arrays. The nano-magnetic elements in such arrays are field-coupled and they require a pulsed magnetic field to alter their logical and/or conductive state. For example, in a typical nano-magnetic element array, groups of nano-magnetic elements are disposed in close proximity to a conductive line (also referred to herein as a current-clock line). Each group can comprise one or more nano-magnetic elements and each nano-magnetic element can comprise one or more nano-magnets. For example, each nano-magnetic element can comprise a row of evenly spaced nano-magnets. In any case, each nano-magnet can be responsive to a current pulse, which is applied to the conductive line by a clock circuit-controlled current driver. The current pulse creates a magnetic field, which causes the state and, particularly, the polarity of the adjacent nano-magnets in the nano-magnetic elements to switch.

However, when the number and density of nano-magnetic elements in an array are high and the conductive line adjacent to these elements is long, the resistance-capacitance (RC) time constant of the conductive line can negatively impact the speed and physical functionality of the array. Specifically, the RC time constant of a relatively long conductive line will limit the switching frequency of the nano-magnets within each element adjacent to that conductive line because the parasitic capacitance along the conductive line as well as the capacitance (and inductive reactance) of the nano-magnetic elements will consume charge (and energy) as current flows along the conductive line. Consumption of the charge will in turn limit the propagation of the current pulse and the amplitude of the current along the line. The propagation of the current along the conductive line is determined by the RC time constant and can be described to the first order by the following equation:

$$I(t)=I\_max(1-e^{**}(-t/RC)), \quad (1)$$

where R is the resistance of the conductive line, C is the capacitance of the conductive line, t is time, and I_Max is the current supplied at the source. Thus, it is shown that the amplitude of the current along the current-clock line is a function of time and distance from the source and will limit the performance of the array.

In view of the foregoing, disclosed herein are nano-magnetic element arrays (e.g., magneto-resistive random access memory (MRAM) arrays or logic arrays). In each nano-magnetic element array, a conductive line can be positioned adjacent to a group of nano-magnetic elements and a multi-level current driver can be electrically connected to an input node on the conductive line. The multi-level current driver can receive a pair of voltage clock signals and at least one voltage reference and based thereon, can selectively change the amount of current applied at the input node between multiple different levels and the nano-magnetic elements can be responsive to these different levels. For example, the multi-level current driver can selectively change the amount of current applied at the input node between a first level that erases the state of the elements, a second level that is less than the first level and that switches the state of the elements and a third or zero level that maintains the state of the elements. The multi-level current driver can further be configured so that the transition from the second level to the third level is gradual to prevent soft errors. The same pair of voltage clock signal lines and the same voltage reference line can be used to supply signals to other multi-level current drivers in the array. Optionally, the voltage reference can be supplied by a bias generator that is configured to allow the voltage reference and, thereby the amount of current flowing to the input node at the first and second levels to be selectively adjusted.

More particularly, referring to FIG. 1, disclosed herein is a nano-magnetic element array 100 (e.g., a magneto-resistive random access memory (MRAM) array or logic array) that allows for greater speed and functionality.

This nano-magnetic element array 100 can comprise a first voltage clock signal generator 130, a first voltage clock signal line 135 electrically connected to the first voltage clock signal generator 130, a second voltage clock signal generator 140, a second voltage clock signal line 145 electrically connected to the second voltage clock signal generator 140, a bias generator 150 and a voltage reference line 155 electrically connected to the bias generator 150.

The first voltage clock signal generator 130 can generate and output (i.e., can be adapted to generate and output, can be configured to generate and output, etc.) a first voltage clock signal ($CLK_1$) to the first voltage clock signal line 135. The second voltage clock signal generator 140 can generate and output (i.e., can be adapted to generate and output, can be configured to generate and output, etc.) a second voltage clock signal ($CLK_2$) to the second voltage clock signal line 145. Clock signal generators are well known in the art and, thus, the details of these clock signal generators are omitted from this specification in order to allow the reader to focus on the salient aspects of the disclosed array. The bias generator 150 can generate (i.e., can be adapted to generate, can be configured to generate, etc.) a voltage reference (Vref) and the voltage reference can be applied to the voltage reference line 155 (see detailed discussion below regarding the bias generator 150).

The nano-magnetic element array 100 can further comprise a first group 101 of nano-magnetic elements and, optionally, a second group 102 of nano-magnetic elements. The first group 101 can comprise one or more nano-magnetic elements and the second group 102 can similarly comprise one or more nano-magnetic elements. The nano-magnetic elements in the first group 101 can be the same or different from the nano-magnetic elements in the second group 102. In any case, each nano-magnetic element in each group can comprise one or more nano-magnets. The nano-magnets in each group may have the same size and may be uniformly spaced. Alternatively, the nano-magnets in each group may have different sizes, non-uniform spacing, etc.

Figure 2:
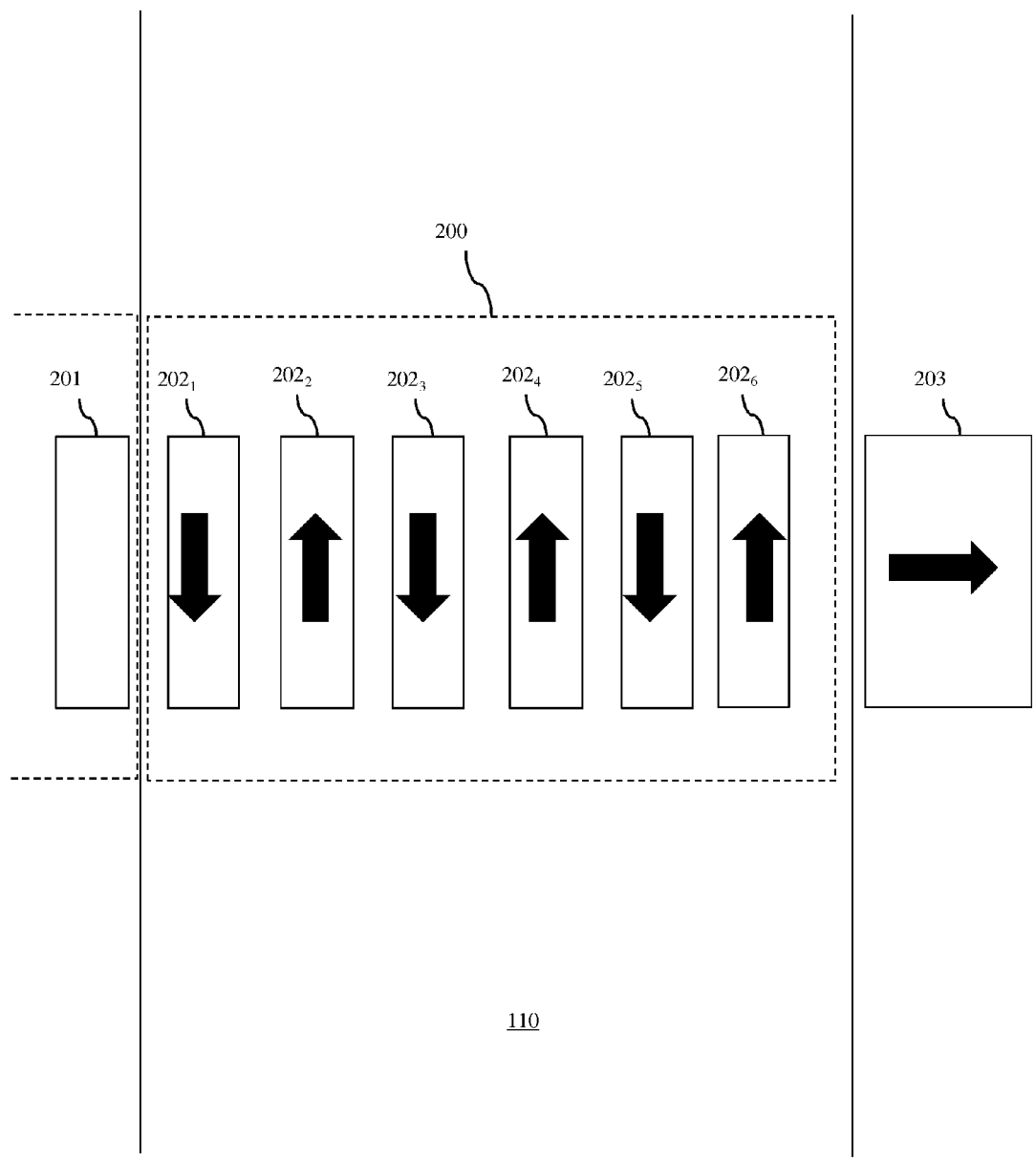
FIG. 2 is top view diagram illustrating an exemplary nano-magnetic element that can be incorporated into the array of FIG. 1.

For example, as illustrated in FIG. 2, each of the nano-magnetic elements 200 can comprise, for example, a row of evenly spaced nano-magnets $202_{1-6}$. The term nano-magnet refers to a magnet with nanometer features sizes. Such nano-magnets can comprise a ferromagnetic metal (e.g., iron, cobalt or nickel). Alternatively, such nano-magnets can comprise a transition metal (e.g., titanium, chromium, or manganese) or rare-earth metal (e.g., gadolinium). Formation of such nano-magnets in an evenly spaced row can be achieved, for example, using conventional lithographic patterning techniques. For illustration purposes, the nano-magnetic element 200 is shown as having six nano-magnetics. However, this exemplary number of nano-magnets is not intended to be limiting and it is anticipated that the nano-magnetic elements in the nano-magnetic element arrays disclosed herein could each comprise any suitable number of nano-magnets (e.g., 1, 2, 3, 4, 5, 6, 7, 8, 9, 10, etc.).

Each of these nano-magnets $202_{1-6}$ in the nano-magnetic element 200 can exhibit only two stable states of magnetization, as represented by the 90° and 270° arrows. Ideally, in their stable states, these nano-magnets $202_{1-6}$ will be anti-ferromagnetically ordered within the nano-magnetic element 200. That is, neighboring nano-magnets $202_{1-6}$ in the row will have opposite states of magnetization, as represented by the alternating 90° and 270° arrows. Depending upon the pattern of the states of magnetization in the nano-magnets in the row, each nano-magnetic element can be used to represent binary data (i.e., a bit value of "0" or "1"). For example, if the last nano-magnet $202_6$ in the row has a 90° polarity, the bit value of the nano-magnetic element 200 may be sensed as a "0", whereas if it has a 270° polarity, the bit value of the nano-magnetic element 200 may be sensed as a "1".

In each nano-magnetic element 200, the first nano-magnet $201_1$ can be adjacent to an input nano-magnet 201. This input nano-magnet 201 can, for example, be the last nano-magnet (i.e., the output nano-magnet) of an adjacent nano-magnetic element. Similarly, in each nano-magnet element 200, the last nano-magnetic $202_6$ (i.e., the output nano-magnet) can be adjacent to another nano-magnet 203. This nano-magnet 203 can be a stabilizer nano-magnet, as shown, which is held at 0°. Alternatively, the nano-magnet 203 can be the first nano-magnet in another nano-magnetic element (not shown)).

Referring again to FIG. 1, the nano-magnetic element array 100 can further comprise a conductive line 110 that facilitates the propagation of binary data into the nano-magnetic elements in the first group 101 and, if applicable, the second group 102. This conductive line 110 can comprise a metal wire. For example, the conductive line 110 can comprise a copper (Cu) wire, aluminum (Al) wire, tungsten (W) wire, titanium (Ti) wire, etc. or a wire made of an alloy of any of these metals. Alternatively, this conductive line 110 can comprise a line of any suitable conductive material (e.g., a line of semiconductor material, such as polycrystalline silicon or monocrystalline silicon, doped with an N-type or P-type dopant). Optionally, the surfaces of the conductive line 110 that are not immediately adjacent to the nano-magnetic elements can be cladded with a magnetic material in order to concentrate the magnetic flux generated by the wire over the region containing the nano-magnetic elements. It should be noted that the input nano-magnet 201 and stabilizer nano-magnet 203 can be located outside the boundaries of the conductive line 110 such that they are non-responsive to current flowing through that conductive line 110.

In any case, this conductive line 110 can comprise a first segment 111 adjacent to (i.e., in close proximity to or immediately adjacent to) and traversing each of the nano-magnetic elements in the first group 101. The conductive line 110 can further comprise an input node 115 at one end of that first segment 111. The first segment 111 and, particularly, the opposite end of the first segment 111 (i.e., the end opposite the input node 115) can be electrically connected to a power supply 195 (e.g., ground). If the nano-magnetic element array 100 also comprises a second group 102 of nano-magnetic elements, the conductive line 110 can comprise a second segment 112 adjacent to (i.e., in close proximity to or immediately adjacent to) and traversing the nano-magnetic elements in the second group 102. This second segment 112 can be electrically connected at one end to the input node 115. The second segment 112 and, particularly, the opposite end of the second segment 112 (i.e., the end opposite the input node 115) can also be electrically connected to the same power supply 195 (e.g., ground). Thus, when there are two segments 111, 112 in the conductive line 110, the input node 115 will be at the center of the conductive line 110 between the two segments 111, 112 and, thereby between the two groups 101, 102 of nano-magnetic elements. Placing the input node 115 at the center of the conductive line 110 as opposed to the end of the conductive line 110 reduces the current flow distance to the length of each segment and, thereby minimizes the negative impact of the resistance-capacitance (RC) time constant on the conductive line 110. Furthermore, the nano-magnetic elements adjacent to each segment 111, 112 of the conductive line 110 can be limited in number so as to limit the required length of each segment 111 and 112 and, thereby further minimize the negative impact of the resistance-capacitance (RC) time constant of the conductive line. Those skilled in the art will recognize that the actual required length of each of the segments will vary greatly depending upon other circuit specifications including, but not limited to, the supply voltage, the sizes of the nano-magnets, the wire geometries, etc.

It should also be noted that depending upon the configuration of the nano-magnetic element array 100, the conductive line 110 can traverse the top surfaces of the nano-magnetic elements in each group and/or the bottom surfaces of the nano-magnetic elements in each group. However, alternatively, if the nano-magnetic elements in each group are aligned vertically, the conductive line 110 can traverse one or both side surfaces of the nano-magnetic elements in each group.

The nano-magnetic element array 100 can further comprise a multi-level current driver 120. This multi-level current driver 120 can comprise an output 125 electrically connected to the input node 115 on the conductive line 110. The multi-level current driver 120 can further comprise a first input 121 electrically connected to the first voltage clock signal line 135 for receiving the first voltage clock signal ($CLK_1$), a second input 122 electrically connected to the second voltage clock signal line 145 for receiving the second voltage clock signal ($CLK_2$) and a third input 123 electrically connected to the voltage reference line 155 for receiving the voltage reference (Vref).

It should be noted that an even number of first inverters 131 can be inserted along the first voltage clock signal line 135 between the first voltage clock signal generator 130 and the first input 121 to buffer transmission of the first voltage clock signal ($CLK_1$) to the multi-level current driver 120 (i.e., to avoid signal degradation of the first voltage clock signal ($CLK_1$) between the first voltage clock signal generator 130 and the first input 121 of the multi-level current driver 120). Similarly, an even number of second inverters 142 can be inserted along the second voltage clock signal line 145 between the second voltage clock signal generator 140 and the second input 122 to buffer transmission of the second voltage clock signal ($CLK_2$) to the multi-level current driver 120 (i.e., to avoid signal degradation of the second voltage clock signal ($CLK_2$) between the second voltage clock signal generator 140 and second input 122 of the multi-level current driver 120). Additionally, a capacitor 151 can be electrically connected in series between the voltage reference line 155 and another power supply 190 (e.g., a positive power supply) in order to prevent noise from altering the voltage reference (Vref) on the voltage reference line 155.

The multi-level current driver 120 can receive the first voltage clock signal ($CLK_1$) on the first voltage clock signal line 135 (as supplied by the first voltage clock signal generator 130), the second voltage clock signal ($CLK_2$) on the second voltage clock signal line 145 (as supplied by the second voltage clock signal generator 140) and the voltage reference (Vref) on the voltage reference line(s) 155 (as supplied by a bias generator 150). The multi-level current driver 120 can selectively change (i.e., can be adapted to selectively change, configured to selectively change, etc.) the amount of current applied to the input node 115 on the conductive line 110 between multiple different levels based on the first voltage clock signal ($CLK_1$), the second voltage clock signal ($CLK_1$) and the voltage reference (Vref) and the nano-magnetic elements can be responsive to the different levels.

For example, based on the pair of voltage clock signals ($CLK_1$ and $CLK_2$) on the voltage clock signal lines 135, 145 and on the voltage reference (Vref) on the voltage reference line 155, the multi-level current driver 120 can change the amount of current output to the input node 115 between a first level, a second level and a third level. As illustrated in the current flow profile graph 300 of FIG. 3A and the voltage clock signals timing diagram of FIG. 3B, the first level 301, which occurs between time periods T0 and T1, can be a relatively high level (e.g., between 300 microamps (μA) and 1100 μA, such as 930 μA) so as to erase the state of the nano-magnetic elements. The second level 302, which occurs between time periods T1 and T2, can be less than first level 301 (e.g., between 50 μA and 250 μA, such as 190 μA) and can switch the state of the nano-magnetic elements. The third level 303, which occurs after time period T2 and is maintained until the next erase state, can be approximately zero so as to maintain (i.e., store, also referred to as drive) the state of the nano-magnetic elements. The multi-level current driver 120 can further be configured so that the transition 304 from the second level 302 to the third level 303 is gradual (e.g., approximately 200-400 μA/nanosecond (ns) as opposed to 200-400 μA/0.1 ns) to prevent soft errors (see detailed discussion below).

Figure 3A:
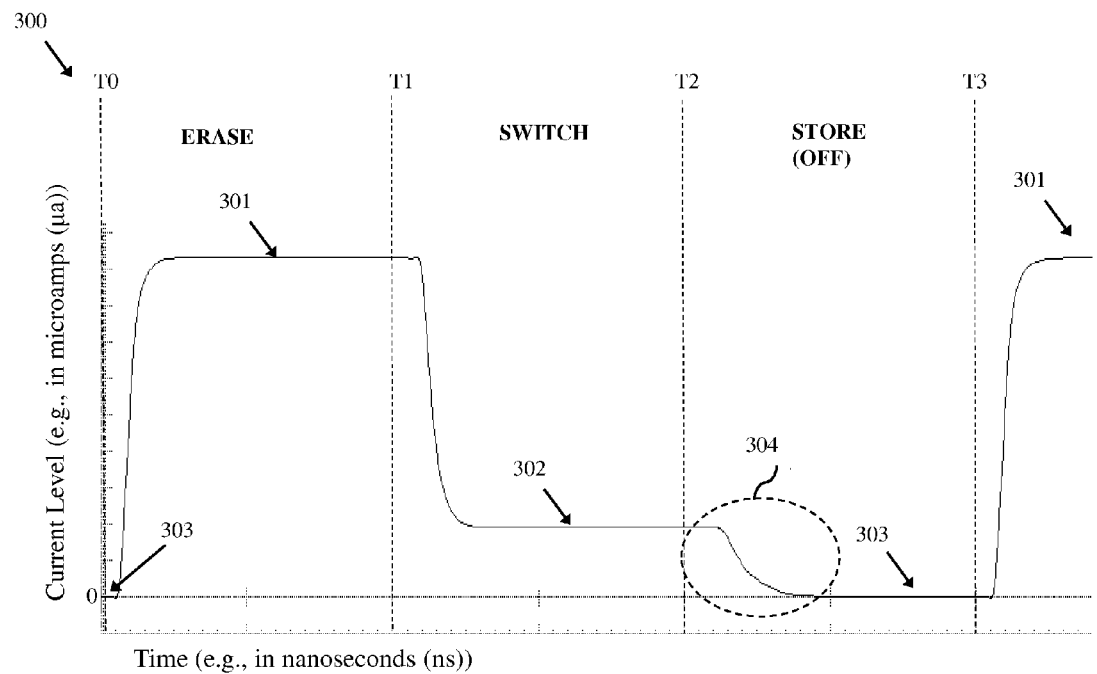
FIG. 3A is a current level profile graph illustrating the first, second and third current levels output by a multi-level current driver incorporated into the array of FIG. 1.
Figure 3B:
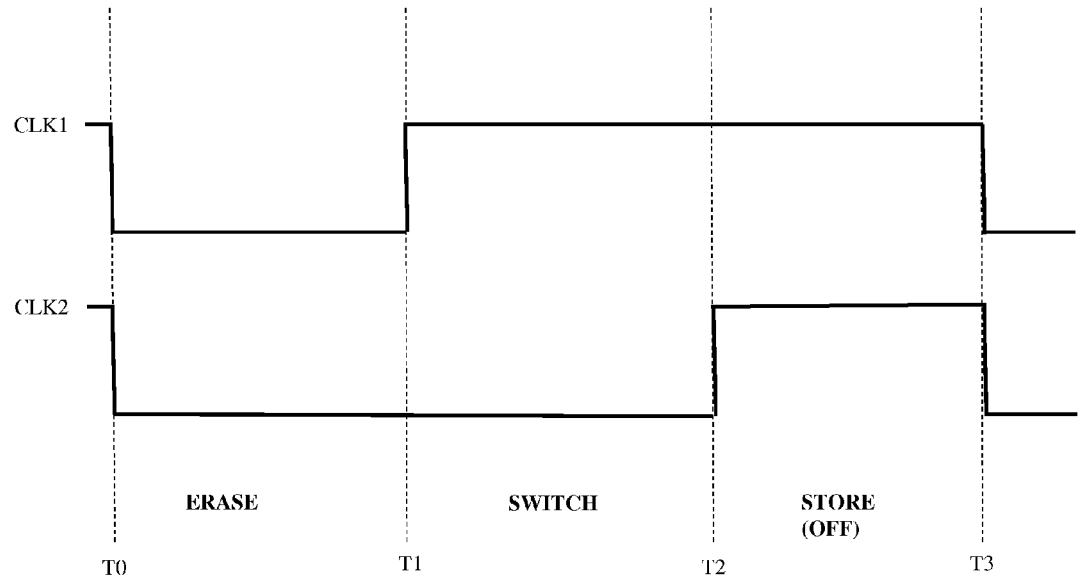
FIG. 3B is a timing diagram illustrating exemplary voltage clock signals that control a multi-level current driver in order to achieve the current level profile of FIG. 3A.
Figure 4A:
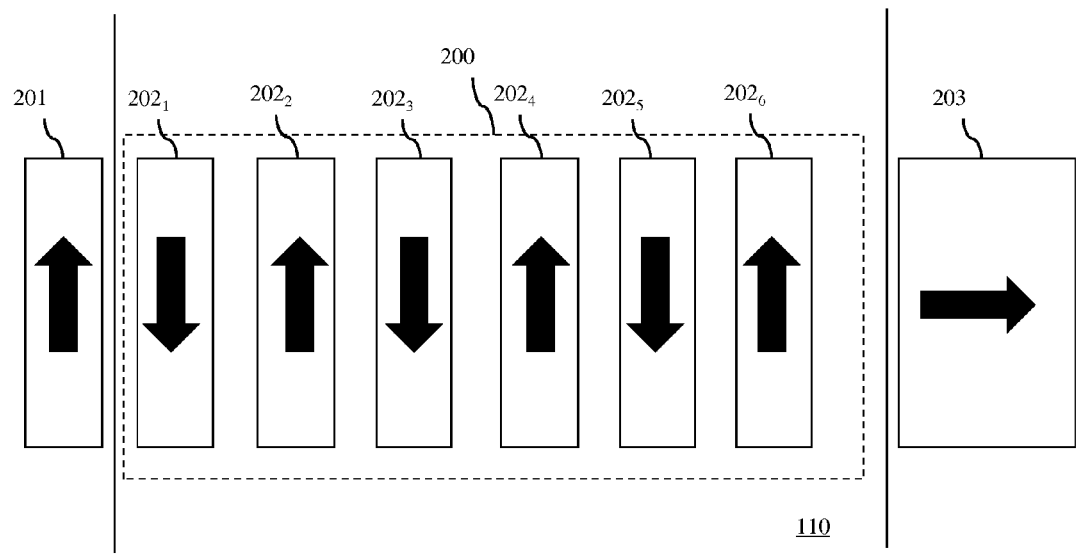
FIG. 4A is a top view diagram illustrating the magnetized states of nano-magnets in a nano-magnetic element in a store state.
Figure 4B:
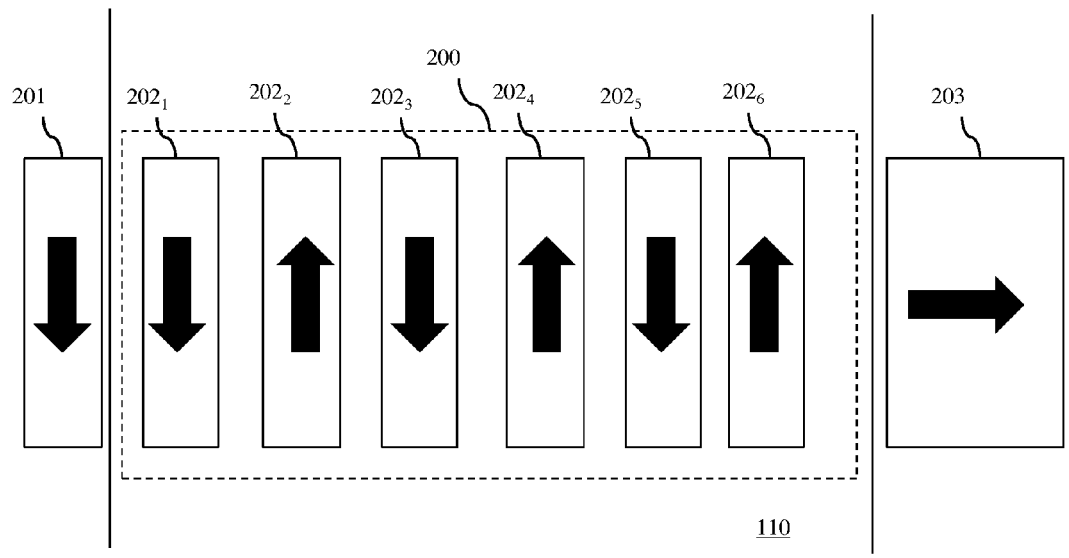
FIG. 4B is a top view diagram illustrating the magnetized states of nano-magnets in a nano-magnetic element at the initiation of an erase state.
Figure 4C:
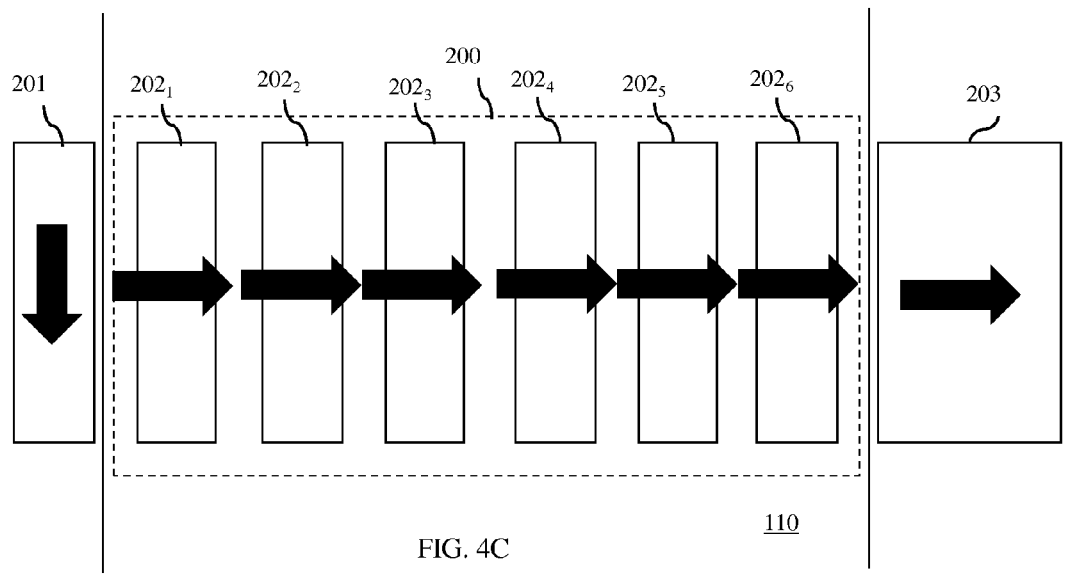
FIG. 4C is a top view diagram illustrating the magnetized states of nano-magnets in a nano-magnetic element in an erase state.
Figure 4D:
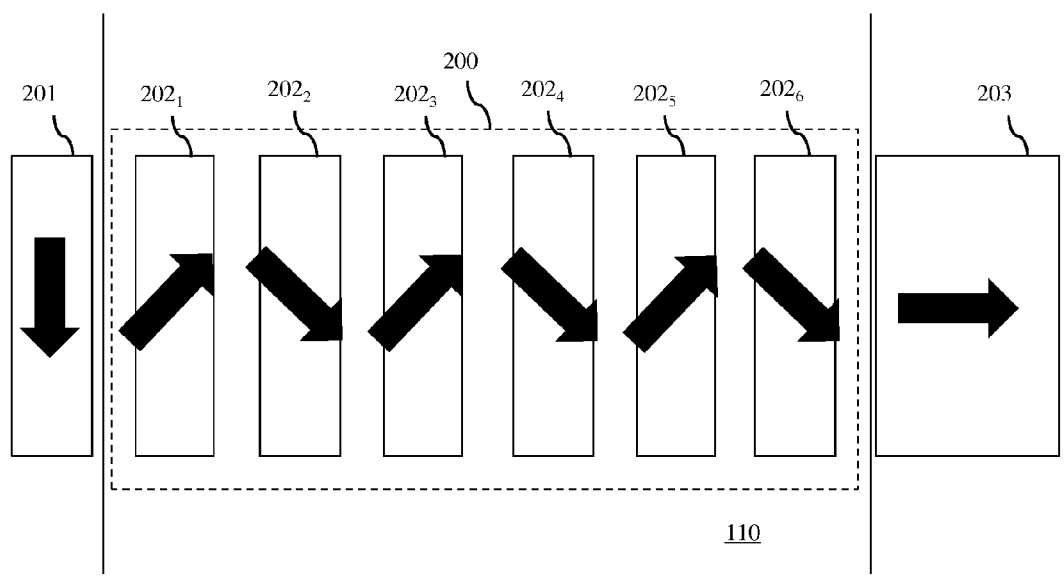
FIG. 4D is a top view diagram illustrating the magnetized states of nano-magnets in a nano-magnetic element in a switch state.
Figure 4E:
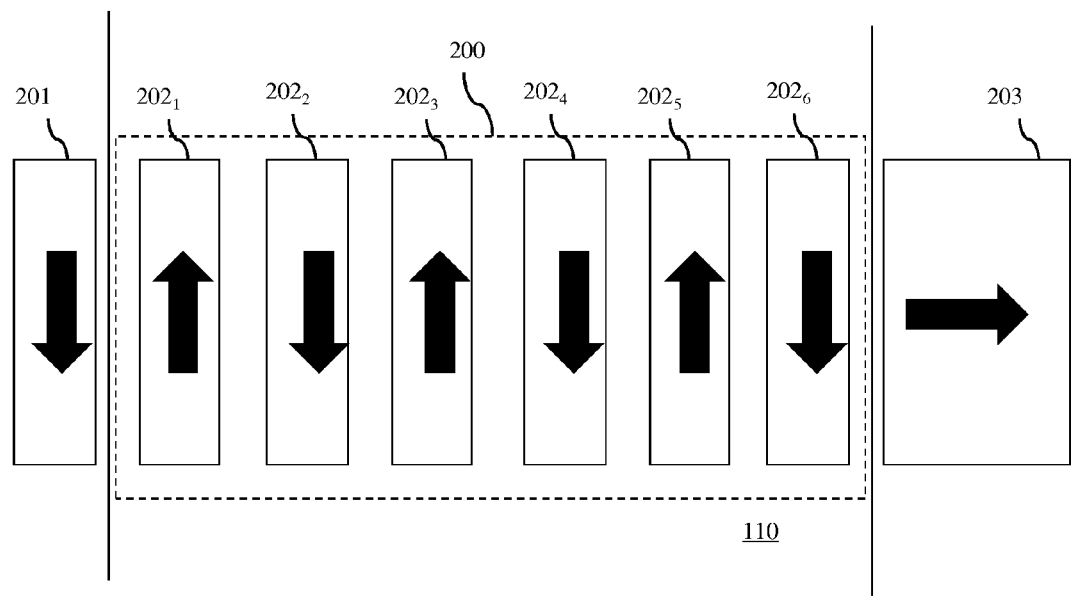
FIG. 4E is a top view diagram illustrating the magnetized state of nano-magnets in a nano-magnetic element in another store state.

FIGS. 4A-4E illustrate the magnetism state changes exhibited by nano-magnets $202_{1-6}$ in the exemplary nano-magnetic element 200 of FIG. 2 at the different current levels 301-303 output by the multi-level current driver 120 of FIG. 1, as shown in the graph of FIG. 3. Specifically, referring to FIGS. 1-3 in combination with FIGS. 4A-4E, FIG. 4A illustrates the nano-magnetic element 200 when the amount of current passing to the input node 115 of the conductive line 110 is at the third or zero level 303. In this case, the nano-magnets $202_{1-6}$ can be anti-ferromagnetically order, exhibiting opposite and stable magnetized states, as represented by the alternating 90° and 270° arrows. The input nano-magnet 201 can exhibit an opposite magnetized state as compared to the first nano-magnet $202_2$ in the nano-magnetic element 200 (e.g., 90° and 270°, respectively). After the input nano-magnet 201 exhibits a change in magnetized state (e.g., from 90° as shown in FIG. 4A to 270°, as shown in FIG. 4B), the current pulse, which is applied to the input node 115 of the conductive line 110 by the multi-level current driver 120 and which has multiple levels, will propagate the change within the nano-magnetic element 200. Specifically, when the current pulse switches from the third or zero level 303 to the first level 301, the relatively large amount of current flowing through the conductive line 110 can create a magnetic field that essentially erases the magnetic states of the nano-magnets $202_{1-6}$ (e.g., forces the magnetized states of all of the nano-magnets toward 0°, as shown in FIG. 4C). When the current pulse switches from the first level 301 to the second level 302, which is less than the first level 301, the lesser amount of current flow at the second level 302 can create a magnetic field that allows the nano-magnetic elements $202_{1-6}$ to fall toward their antiferromagnetically ordered stable states, given the current magnetic state (e.g., of 270°) of the input nano-magnet 201 (as shown in FIG. 4D). Finally, when the current pulse switches from the second level 302 back to the third or zero level 303, the magnetic field is eliminated and the magnetized state of the nano-magnets $202_{1-6}$ will completely relax into an anti-ferromagnetically ordered state (as shown in FIG. 4E) and remain stable (i.e., stored).

Figure 5:
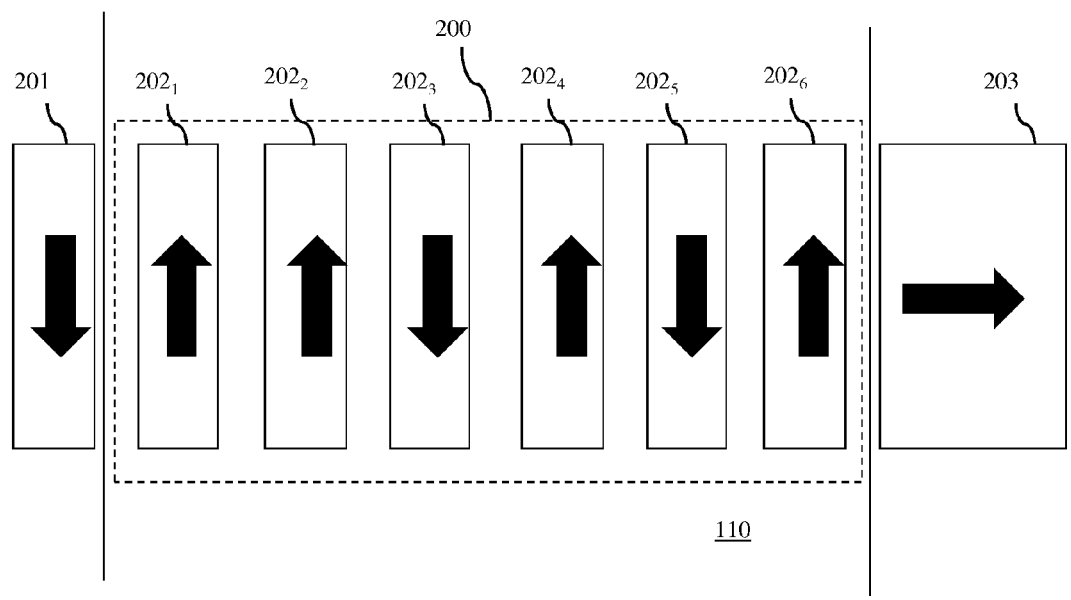
FIG. 5 is a top view diagram illustrating the magnetized state of nano-magnets in a nano-magnetic element when a switching error occurs.

It should be noted, however, that if the transition between the second level 302 to the third or zero level 303 is abrupt (e.g., 200-400 μA/0.1 ns or faster), nano-magnets might switch out of order. As a result, the logically correct antiferromagnetic order may not be maintained (i.e., one or more nano-magnets might not assume the lowest possible energy state with respect to their immediately adjacent neighbors). For example, as illustrated in FIG. 5, nano-magnet $202_2$ may switch before nano-magnet $202_1$ resulting in both nano-magnets assuming the same magnetized state (e.g., of 270°). This switching error thereby causes the magnetized states of the adjacent nano-magnets $202_3$ through $202_6$ to also be incorrect such that the bit stored in the nano-magnetic element 200 is incorrect. Therefore, the multi-level current driver 120 can be configured so that the transition 304 between the second level 302 and third or zero level 303, as shown in FIG. 3, is gradual (e.g., approximately 200-400 μA/nanosecond (ns)) in order to allow the nano-magnets $202_{1-6}$ to assume the lowest possible energy state with respect their immediately adjacent neighbors and, thereby to avoid soft errors.

It should be noted that, although not shown, the multi-level current driver 120 could further be configured so that the transition between the first level 301 and second level 302 is similarly gradual.

Figure 6A:
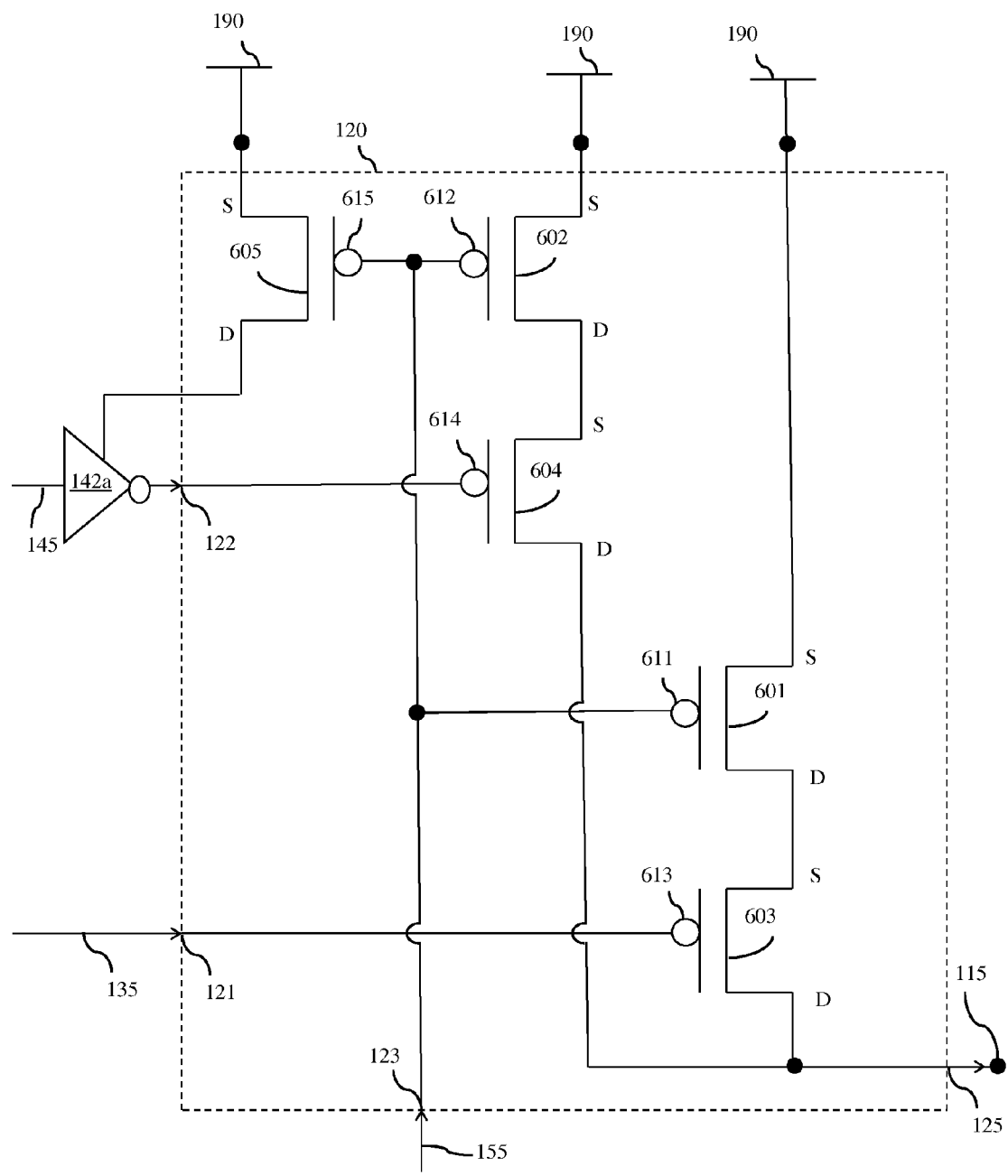
FIG. 6A is a schematic diagram illustrating an exemplary multi-level current driver that can be incorporated into the array of FIG. 1.

FIG. 6A is a schematic diagram illustrating an exemplary multi-level current driver 120 configured to achieve the current flow profile illustrated in the graph of FIG. 3 and described in detail above.

Referring FIG. 6A in combination with FIGS. 1-3B, this multi-level current driver 120 can comprise a first transistor 601 (e.g., a first P-type field effect transistor (PFET)) that is electrically connected at its source to the power supply 190 (e.g., a positive power supply). This first transistor 601 can have a first gate 611 that is electrically connected to the third input 123 and, thereby controlled by the voltage reference on the voltage reference line 155 from the bias generator 150.

The multi-level current driver 120 can further comprise a second transistor 602 (e.g., a second PFET) that is similarly electrically connected at its source to the power supply 190. This second transistor 602 can have a second gate 612 that is also electrically connected to the third input 123 and, thereby controlled by the voltage reference (Vref) on the voltage reference line 155 from the bias generator 150.

The multi-level current driver 120 can further comprise a third transistor 603 and a fourth transistor 604. The third transistor 603 (e.g., a third PFET) can be electrically connected in series between the first transistor 601 and the input node 115 of the conductive line 110. This third transistor 603 can have a third gate 613 electrically connected to the first input 121 and, thereby controlled by the first voltage clock signal from the first voltage clock signal generator 130 on the first voltage clock signal line 135. The fourth transistor 604 (e.g., a fourth PFET) can be electrically connected in series between the second transistor 602 and the input node 115 on the conductive line 110. This fourth transistor 604 can have a fourth gate 614 electrically connected to the second input 122 and, thereby controlled by the second voltage clock signal from the second voltage clock signal generator 140 on the second voltage clock signal line 145.

The multi-level current driver 120 can further comprise a fifth transistor 605 (e.g., a fifth PFET) that is electrically connected at its source to the positive power supply 190 and at its drain to the second inverter 142 of the pair of second inverters inserted along the second voltage clock signal line 145. Like the first transistor 601 and second transistor 602, this fifth transistor 605 can comprise a fifth gate 615 electrically connected to the third input 123 and, thereby controlled by the voltage reference on the voltage reference line 155 from the bias generator 150.

With a multi-level current driver 120 configured as described above and illustrated in FIG. 6A, the first transistor 601 is a current source and the flow of current from this current source is controlled by the first voltage clock signal ($CLK_1$). The current flow from the first transistor 601 to the input node 115 of the conductive line 110 is controlled by the voltage reference (Vref) and is gated by the third transistor 603, which functions as a switch. Similarly, the second transistor 602 is another current source and the flow of current from this current source is controlled by the second voltage clock signal ($CLK_2$). The current flow from the second transistor 602 to the input node 115 of the conductive line 110 is controlled by the voltage reference (Vref) and is gated by the fourth transistor 604, which functions as a switch.

Those skilled in the art will recognize that for PFETs to be in an 'on' or conducting state their gate voltage must be low and for PFETs to be in an 'off' or non-conducting state their gate voltage must be high. Thus, referring to the voltage clock signals timing diagram of FIG. 3B in combination with the current flow profile graph of FIG. 3A, in one example where the transistors 601-604 comprise PFETs, the first level 301 of current at the input node 115 of the conductive line 110 and, thereby an erase state, can be achieved between time periods T0 and T1, when the first voltage clock signal ($CLK_1$) and the second voltage clock signal ($CLK_2$) are both low, such that the switches formed by the third transistor 603 and fourth transistor 604 are both in on states (i.e., are on) so as to allow currents from the current sources formed by the first transistor 601 and the second transistor 602 to be combined at the input node 115 for maximum current flow on the conductive line 110. The second level 302 of current at the input node 115 of the conductive line 110 and, thereby the switch state, can be achieved between time periods T1 and T2, when the first voltage clock signal ($CLK_1$) is high such that the third transistor 603 is in an off state (i.e., is off) and the second voltage clock signal ($CLK_2$) is low such that the fourth transistor 604 is in an on state (i.e., is on) so as to allow current from only the second transistor 602 to flow to the input node 115. The third level 303 and, particularly, the zero level and, thereby the store or off state, can be achieved after time period T2, when the first voltage clock signal ($CLK_1$) and the second voltage clock signal ($CLK_2$) are both high, such that the third transistor 603 and fourth transistor 604 are both in off states (i.e., are both off), leaving the current level into the input node 115 and, thereby on the conductive line 110 at zero.

It should be noted that the sizes of the transistors and, particularly, the sizes of the first transistor 601 and second transistor 602 can be different in order to vary the relative amount of current flow at the first level 301 and the second level 302. For example, the first transistor 601 can be larger than the second transistor 602 and, particularly, the channel width-to-length ratio of the first transistor 601 can be larger than the channel width-to-length ratio of the second transistor 602 (e.g., 2 times larger, 4 times larger, etc.) such that the first current from the first transistor 601 and gated by the third transistor 603 is greater than a second current from the second transistor 602 and gated by the fourth transistor 604. As a result, as shown in the graph of FIG. 3A, the amount of current flow to the input node 115 of the conductive line 110 at the first level 301 (e.g., 930 µA) can be significantly larger than the amount of current flow at the second level 302 (e.g., 190 µA).

As mentioned above, the multi-level current driver 120 can further comprise the fifth transistor 605 (e.g., a fifth PFET). This fifth transistor 605 can comprise yet another current source. Like the first transistor 601 and second transistor 602, this fifth transistor 605 can comprise a fifth gate 615 electrically connected to the third input 123 and, thereby controlled by the voltage reference (Vref) on the voltage reference line 155 from the bias generator 150. In this case, however, the drain of the fifth transistor 605 is electrically connected to the second inverter 142a. The second inverter 142 is that second inverter directly connected to the second input 122 of the multi-level current driver 120 and, thus, supplies the second voltage clock signal ($CLK_2$) to that second input 122. As discussed above, an even number of second inverters 142 (including second inverter 142a) are inserted along the second voltage clock signal line 145 between the second voltage clock signal generator 140 and the second input 122 of the multi-level current driver 120. Thus, the second voltage clock signal ($CLK_2$) is buffered at the second input 122 by the second inverter 142a and then directly transmitted to the fourth gate 614 of the fourth transistor 604. In operation, the amount of current flow from the drain of the fifth transistor 605 into this second inverter 142a will control and, particularly, slow the amount of current from the second inverter 142a to the fourth gate 614 of the fourth transistor 604 so that the transition 304 rate at which the current amount switches from the second level 302 to the third or zero level 303 is gradual.

It should be noted that the duty factors and timings of the pair of voltage clock signals should be designed to achieve the desired durations of the three operations (i.e., erase, switch, and store) described above in order to optimize the operability of the nano-magnetic elements. The timing of the pair of voltage clock signals ($CLK_1$ and $CLK_2$) on the first voltage clock signal line 135 and the second voltage clock signal line 145 can be predicted using traditional chip timing tools so that the erase process at the first level is complete before the switch process at the second level begins and so that the switch process at the second level is complete before the current flow is turned off. Additionally, since the voltage clock signals each essentially provide a single circuit delay from a point on the voltage-clock network, the voltage clock timings are predictable by existing ASIC logic synthesis tools.

Figure 6B:
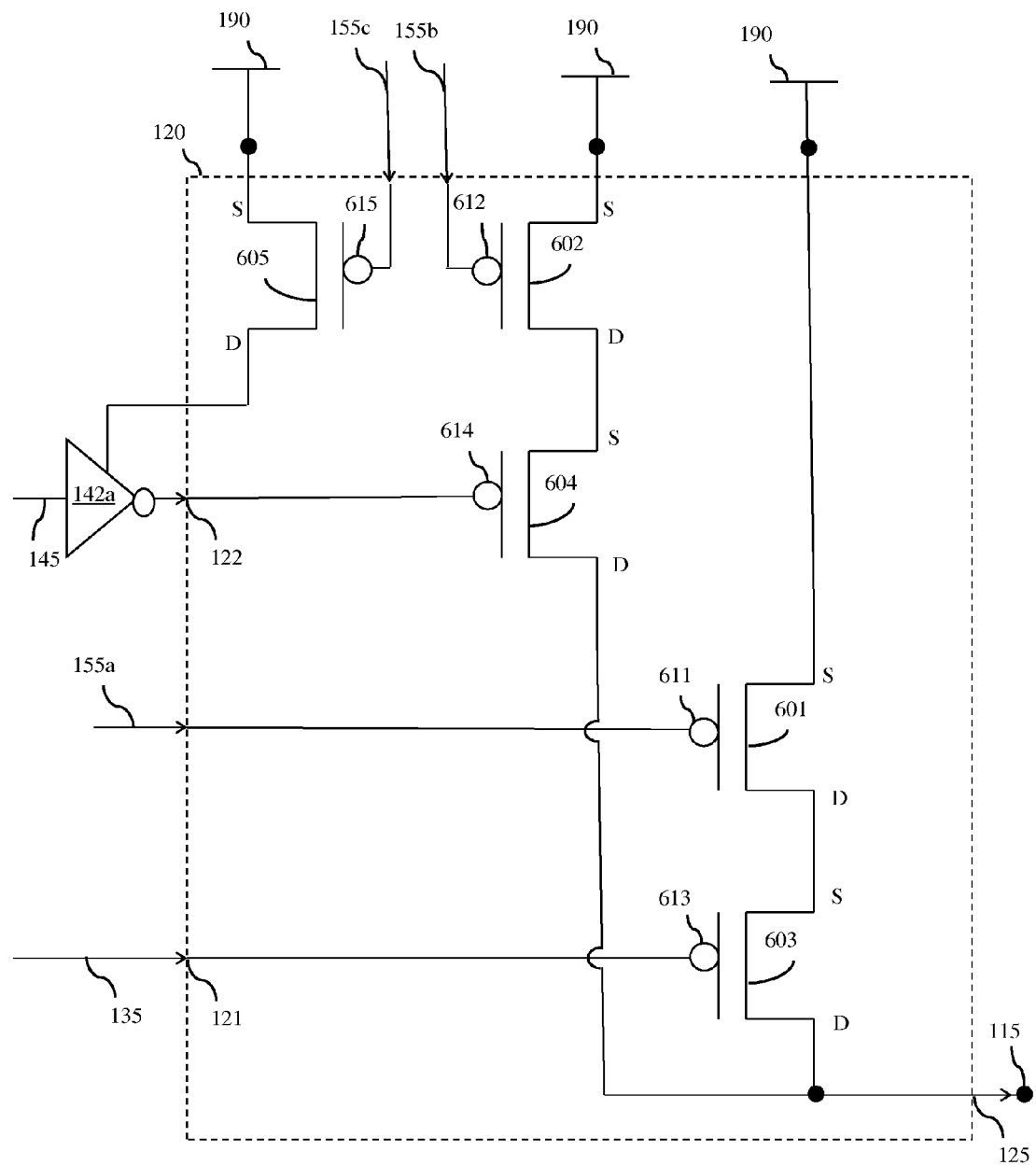
FIG. 6B is a schematic diagram illustrating another exemplary multi-level current driver that can be incorporated into the array of FIG. 1.

In the multi-level current driver 120 described above and illustrated in FIG. 6A, the same voltage reference line 155 supplies the same voltage reference to each of the transistors 601-602 and 605 (i.e., the current sources). However, alternatively, as illustrated in FIG. 6B, any two or more of the transistors 601-602 and 605 can be controlled by different voltage references on different voltage references lines 155a-c and supplied by the same or different bias generators.

Additionally, for illustration purposes, the transistors 601-605 are described above and shown in FIGS. 6A and 6B as being PFETs. However, it should be understood that, alternatively, the multi-level current driver 120 could be configured such that all of the transistors 601-605 are n-type field effect transistor (NFETs). Those skilled in the art will recognize that in this case opposite voltage clock signals would be required to place the transistors 601-602 and 603 in the required states to achieve the first, second, and third levels of current. That is, those skilled in the art will recognize that for NFETs to be in an 'on' or conducting state their gate voltage must be high and for NFETs to be in an 'off' or non-conducting state their gate voltage must be low. Thus, in one example (not shown) where the transistors 601-605 comprise NFETs, the first level 301 of current at the input node 115 of the conductive line 110 and, thereby the erase state can be achieved when the first voltage clock signal ($CLK_1$) and the second voltage clock signal ($CLK_2$) are both high such that the switches formed by the third transistor 603 and fourth transistor 604 are both in on states (i.e., are on) so as to allow currents from the current sources formed by the first transistor 601 and the second transistor 602 to be combined at the input node 115 for maximum current flow on the conductive line 110. The second level 302 of current at the input node 115 of the conductive line 110 and, thereby the switch state can be achieved when the first voltage clock signal ($CLK_1$) is low such that the third transistor 603 is in an off state (i.e., is off) and the second voltage clock signal ($CLK_2$) is high such that the fourth transistor 604 is in an on state (i.e., is on) so as to allow current from only the second transistor 602 to flow to the input node 115. The third level 303 and, particularly, the zero level and, thereby the store or off state can be achieved when the first voltage clock signal ($CLK_1$) and the second voltage clock signal ($CLK_2$) are both low such that the third transistor 603 and fourth transistor 604 are both in off states (i.e., are both off), leaving the current level into the input node 115 and, thereby on the conductive line 110 at zero.

In any case, a bias generator 150 incorporated into the nano-magnetic element array 100 of FIG. 1 can comprise a conventional bias generator configured to supply a voltage reference of a predetermined fixed value to the voltage reference line 155. Such conventional bias generators operate using current mirror techniques and are well known in the art and, thus, the details are omitted from this specification in order to allow the readers to focus on the salient aspects of the disclosed array.

Alternatively, however, the bias generator 150 can be configured to provide a first current mirror voltage reference as the voltage reference (Vref) to the voltage reference line 155 so that the current levels 301-303, as shown in the graph of FIG. 3, are essentially independent of variations on the power supply 190, variations in temperature and/or variations in processing conditions. This bias generator 150 can further be configured so that this current mirror voltage reference can be selectively adjusted. By selectively adjusting the current mirror voltage reference and, particularly, the Vref, essentially the same current profile shape as shown in the graph of FIG. 3 can be achieved but with different first and second current levels.

Figure 7:
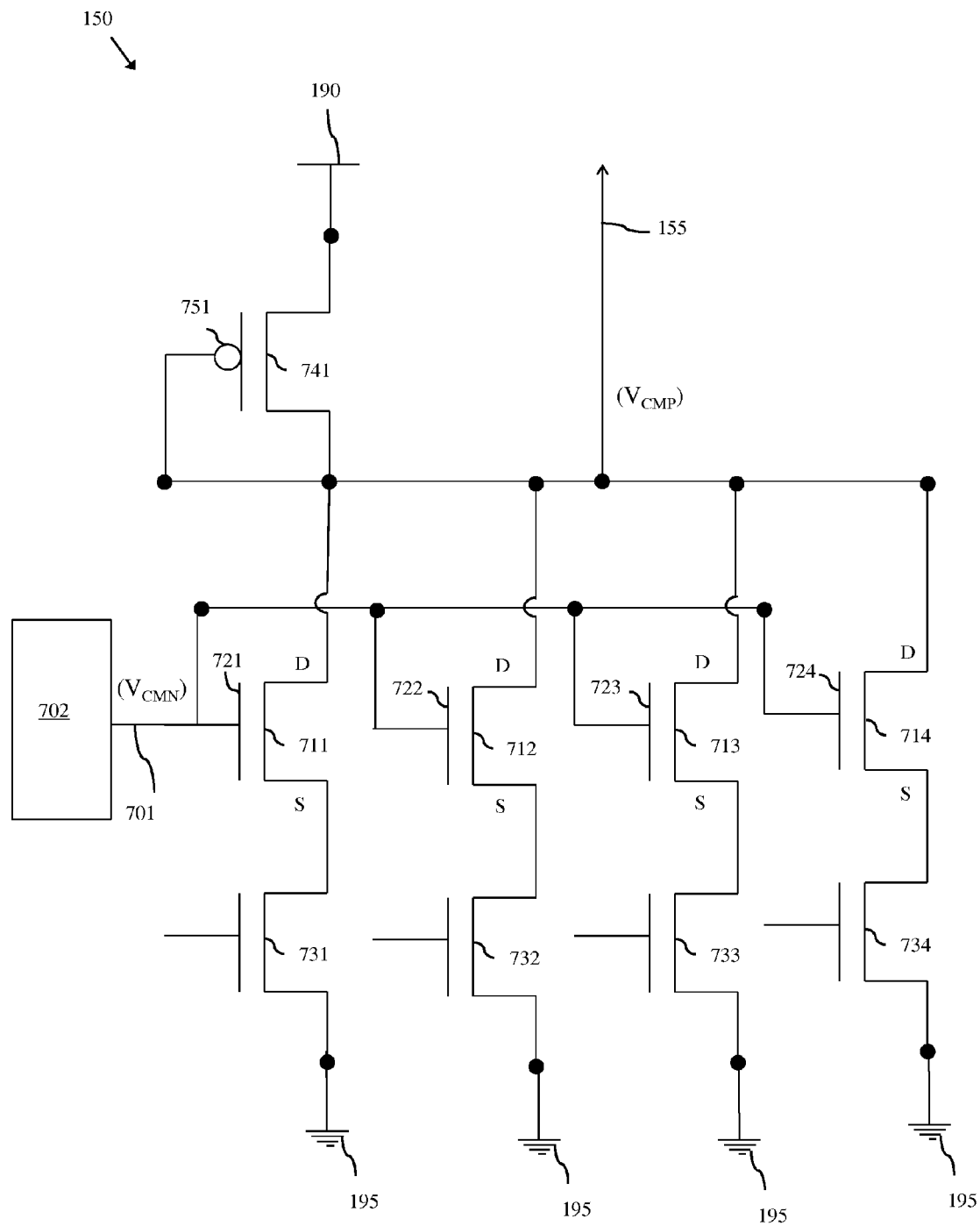
FIG. 7 is a schematic diagram illustrating an exemplary bias generator that can be incorporated into the array of FIG. 1.

FIG. 7 is a schematic diagram illustrating an exemplary bias generator 150 configured to generate a first current mirror voltage reference as the voltage reference (Vref) and to allow that first current mirror voltage reference to be selectively adjusted. This first current mirror voltage reference can comprise a PFET current mirror voltage reference ($V_{CMP}$) when all of the transistor 601-605 in the multi-level current driver 120 comprise PFETs). Referring to FIG. 7 in combination with FIGS. 1-3, this bias generator 150 can specifically comprise a digital-to-analog converter (DAC) circuit configured to set the voltage reference (Vref) on the voltage reference line 155 and, particularly, to set a PFET current mirror voltage reference ($V_{CMP}$) on the voltage reference line 155 in order control the current levels 301-303 applied to the input node 115 of the conductive line 110 for erasing, switching and storing, respectively, the magnetized states of the nano-magnets in the nano-magnetic elements, as described above.

To accomplish this, the bias generator 150 can comprise a fixed current voltage reference line 701 that receives a fixed current voltage reference (e.g., an NFET current mirror voltage reference ($V_{CMN}$)). This fixed current voltage reference can be received, for example, from an on-chip current reference circuit 702. The current reference circuit 702 can comprise, for example, a conventional bandgap reference circuit. Such bandgap reference circuits are well known in the art and, thus, the details are omitted from this specification in order to allow the reader to focus on the salient aspects of the disclosed array. Alternatively, this fixed current voltage reference can be received from an external input.

The bias generator 150 can further comprise a first type conductivity field effect transistor 741 (e.g., a PFET) and a plurality of second type conductivity field effect transistors 711-714 (e.g., a plurality of NFETs). The second type conductivity field effect transistors 711-714 can have corresponding gates 721-724 electrically connected to and, thereby controlled by the fixed current voltage reference (e.g., $V_{CMN}$). The second type conductivity field effect transistors 711-714 can be binary-weighted current sources with relative sizes (e.g., channel width-to-length ratios) of 1, 2, 4, and 8, respectively. These second type conductivity field effect transistors 711-714 can be electrically connected in parallel (e.g., at their drains) to the voltage reference line 155. The second type conductivity field effect transistors 711-714 can also each be electrically connected in series to the power supply 195 (e.g., to ground) by corresponding switches 731-734 (e.g., additional second type conductivity field effect transistors). The first type conductivity field effect transistor 741 can have a gate 751 electrically connected to the voltage reference line 155 and, thereby can be controlled by the voltage reference (e.g., by $V_{CMP}$). Additionally, this first type conductivity field effect transistor 741 can be electrically connected (e.g., at its drain) to the voltage reference line 155 and, finally, can be electrically connected (e.g., at its source) to the power supply 190 (e.g., to a positive power supply).

Figure 8:
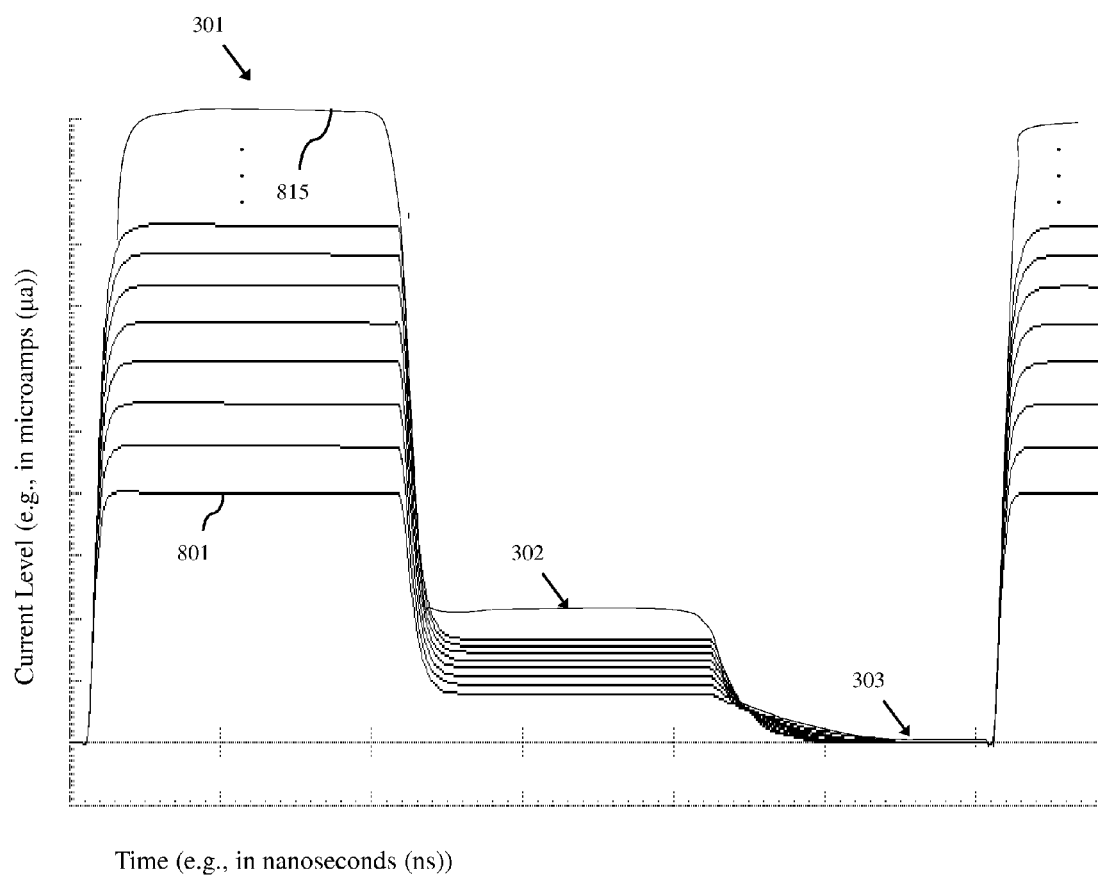
FIG. 8 is a current level profile graph illustrating exemplary adjustable current levels that can be achieved by the multi-level current driver of FIG. 6A when the array of FIG. 1 incorporates the bias generator of FIG. 7.

Configured in this manner, the switches 731-734 are individually selectable, alone or in combination, to adjust the voltage reference (e.g., $V_{CMP}$) on the voltage reference line 155. Specifically, the switches 731-734 function as digital control switches and the first type conductivity field effect transistor 741 functions as a current mirror reference. The number and combination of these switches 731-734 selected will control the total amount of current conducting through the first type conductivity field effect transistor 741 and, thereby the first current mirror voltage reference (e.g., $V_{CMP}$) on the voltage reference line 155. Thus, in this case, the first current mirror voltage reference (e.g., $V_{CMP}$) is adjustable by bias generator 150 to 15 different current-mirror voltage reference level settings (e.g., 15 different $V_{CMP}$ settings). As discussed above and illustrated in FIG. 6A, the voltage reference line 155 is wired to the gates of the field effect transistors 601, 602 and 605 (i.e., the current sources) such that each of these current sources will conduct a multiple of the first current mirror voltage reference (e.g., the $V_{CMP}$) set by the bias generator 150. Thus, the 15 current mirror voltage reference level settings provided by the bias generator 150 allow the amount of current output to the input node 115 at the different levels 301-303 to thereby be selectively adjusted in order to achieve 15 different current profiles 801-815, as shown in the graph of FIG. 8. As illustrated, each of these current profiles has essentially the same shape, but with different current amounts at the first level 301 and second level 302, as discussed in detail above with regard to the graph of FIG. 3. Selection of the different 15 current mirror voltage reference level settings can be made in order to optimize power consumption and functionality of the nano-magnetic element array 100.

The bias generator 150 described above and illustrated in FIG. 7 is shown as having four second type conductivity field effect transistors 711-714 electrically connected in parallel to the voltage reference line 155 and in series to four corresponding switches 731-734, thereby providing the 15 current mirror voltage reference level settings. However, it should be understood that any number of two or more second type conductivity field effect transistors with corresponding switches could be used with the number of field effect transistors and corresponding switches determining the number of available current mirror voltage reference level settings. In any case, the switches 731-734 can be set in order to achieve the desired voltage reference on the voltage reference line 155 using any number of different techniques. For example, they can be set by a tester connection, a fuseable array, or by on-chip control circuitry. Additionally, adaptive techniques can used to allow a specific voltage reference to be selected in response to processing parameters and/or present operating conditions such as temperature. Furthermore, the total amount of current conducting through the first type conductivity field effect transistor 741 should typically by design be less than 1-mA. The current levels 301-303 output by the multi-level current driver 120 can be set in the mA or Amp range by scaling of the voltage reference (e.g., by scaling the $V_{CMP}$ level) as well as the sizes (i.e., the channel width-to-length ratios) of the field effect transistors 601-602 (i.e., the current sources) with the multi-level current driver 120, as shown in FIGS. 6A and 6B.

For illustration purposes, the first type conductivity field effect transistor 741 is described above and illustrated in FIG. 7 as a PFET and the second type conductivity field effect transistors 711-714 and the corresponding switches 731-734 are described above and illustrated in FIG. 7 as NFETs. Those skilled in the art will recognize that this configuration would be appropriate if all of the transistors 601-605 in the multi-level current driver 120 comprise PFETs and the voltage reference (Vref) is to comprise a PFET current mirror voltage reference ($V_{CMP}$). However, it should be understood that, if all the transistors 601-605 in the multi-level current driver 120 were to comprise NFETs as opposed to PFETs, the voltage reference (Vref) should, comprise an NFET current mirror voltage reference ($V_{CMN}$) with the first type conductivity field effect transistor 741 comprising an NFET and the second type conductivity field effect transistors 711-714 and the corresponding switches 731-734 comprising PFETS.

A nano-magnetic array 100, such as that described above and illustrated in FIG. 1, can comprise multiple multi-level current drivers 120 each providing a current pulse to the input node of a corresponding conductive line 110. In this case, at least some of the multiple multi-level current drivers 120 could be controlled by the same pair of voltage clock signals on the same voltage clock signal lines 135, 145 and by the same voltage reference on the same voltage reference line 155.

Figure 9:
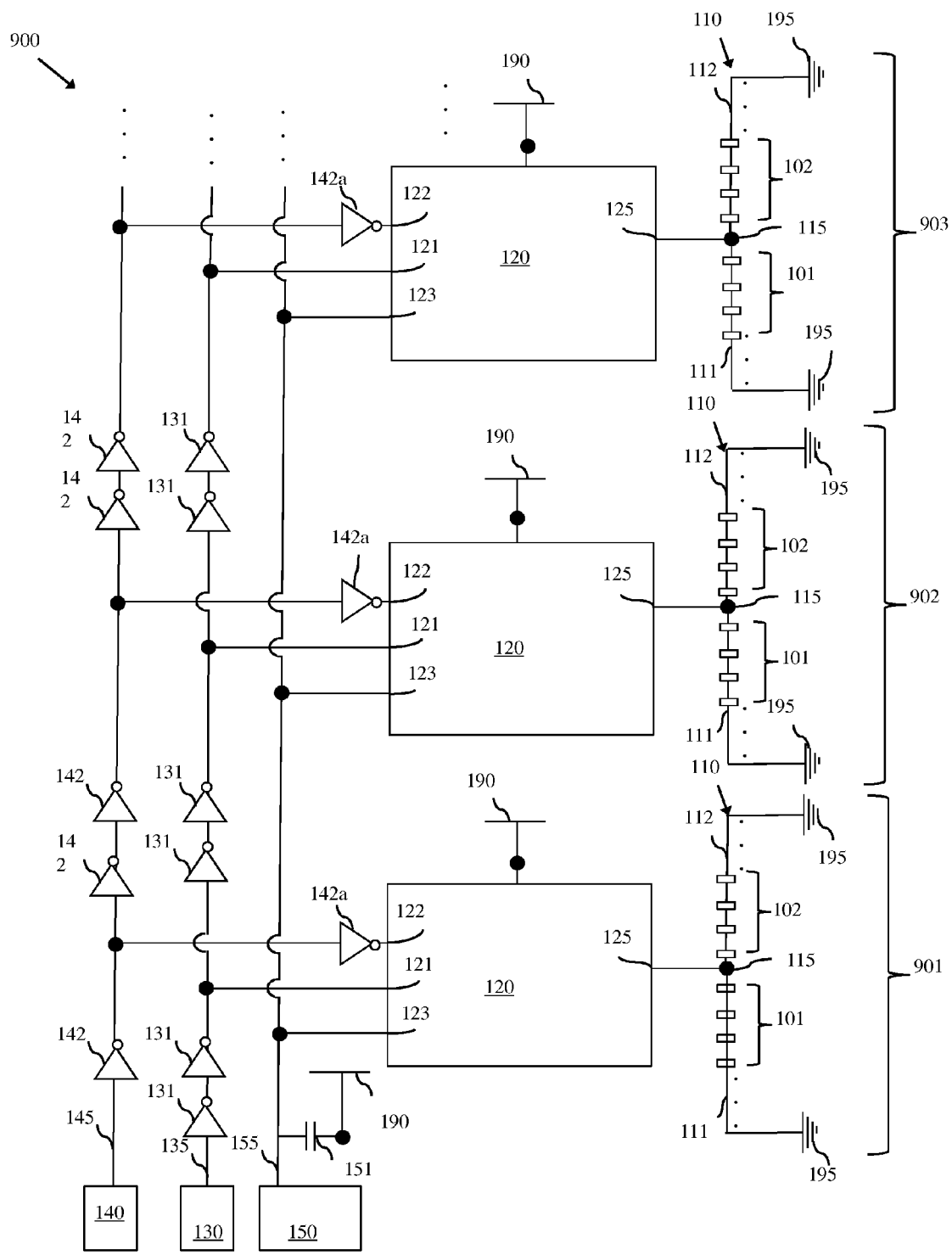
FIG. 9 is a schematic diagram illustrating another nano-magnetic element array.

Specifically, FIG. 9 is a schematic diagram illustrating a nano-magnetic element array 900. This nano-magnetic element array 900, like the nano-magnetic element array 100 of FIG. 1, can comprise a first voltage clock signal generator 130, a first voltage clock signal line 135 electrically connected to the first voltage clock signal generator 130, a second voltage clock signal generator 140, a second voltage clock signal line 145 electrically connected to the second voltage clock signal generator 140, a bias generator 150 and a voltage reference line 155 electrically connected to the bias generator 150, as described in detail above.

Additionally, the nano-magnetic element array 900 can further comprise a plurality of sections 901-903. For illustration purposes, three sections 901-903 are shown and those sections 901-903 are vertically aligned; however, it should be understood that any number of two or more sections could be incorporated into the array 900 and any suitable placement of the sections relative to each other could be used (e.g., horizontally aligned, horizontally and vertically aligned, etc.)

Each section 901-903 of the nano-magnetic element array 100 can comprise a first group 101 of nano-magnetic elements and, optionally, a second group 102 of nano-magnetic elements (see detailed discussion above with regard to FIG. 2).

Each section 901-903 of the nano-magnetic array 900 can further comprise a conductive line 110 that facilitates the propagation of binary data into the nano-magnetic elements in the first group 101 and, if applicable, the second group 102. This conductive line 110 can comprise a first segment 111 adjacent to (i.e., in close proximity to or immediately adjacent to) and traversing each of the nano-magnetic elements in the first group 101. The conductive line 110 can further comprise an input node 115 at one end of that first segment 111. The first segment 111 and, particularly, the opposite end of the first segment 111 (i.e., the end opposite the input node 115) can be electrically connected to ground 195. If the nano-magnetic element array 100 also comprises a second group 102 of nano-magnetic elements, the conductive line 110 can comprise a second segment 112 adjacent to (i.e., in close proximity to or immediately adjacent to) and traversing the nano-magnetic elements in the second group 102. This second segment 112 can be electrically connected at one end to the input node 115. The second segment 112 and, particularly, the opposite end of the second segment 112 (i.e., the end opposite the input node 115) can also be electrically connected to ground 195. Thus, when there are two segments 111, 112 in the conductive line 110, the input node 115 will be at the center of the conductive line 110 between the two segments 111, 112 and, thereby between the two groups 101, 102 of nano-magnetic elements. Placing the input node 115 at the center of the conductive line 110 as opposed to the end of the conductive line 110 reduces the current flow distance to the length of each segment and, thereby minimizes the negative impact of the resistance-capacitance (RC) time constant on the conductive line 110.

Each section 901-903 of the nano-magnetic array 900 can further comprise a multi-level current driver 120. Each multi-level current driver 120 can comprise an output 125 electrically connected to the input node 115 on the conductive line 110 in that same section. Each multi-level current driver 120 can further comprise a first input 121 electrically connected to the first voltage clock signal line 135 for receiving the first voltage clock signal, a second input 122 electrically connected to the second voltage clock signal line 145 for receiving the second voltage clock signal and a third input 123 electrically connected to the voltage reference line 155 for receiving the voltage reference. Each multi-level current driver 120 can further be configured, as described in detail above and illustrated in FIG. 6A. Thus, each multi-level current driver 120 in each section 901-903 can selectively change (i.e., can be adapted to selectively change, configured to selectively change, etc.) the amount of current applied to the input node 115 on the conductive line 110 in the same section based on the same first voltage clock signal from the same first voltage clock signal generator 130, the same second voltage clock signal from the same second voltage clock signal generator 140 and the same voltage reference from the same bias generator 150.

It should be noted that the first inverters 131 can be inserted along the first voltage clock signal line 135 such that only an even number of first inverters 131 are on the first voltage clock signal line 135 between the first voltage clock signal generator 130 and any given multi-level current driver 120 to buffer transmission of the first voltage clock signal ($CLK_1$) to that multi-level current drivers 120 (i.e., to avoid signal degradation of the first voltage clock signal between the first voltage clock signal generator 130 and each of the multi-level current drivers 120). Similarly, the second inverters 142 can be inserted along the second voltage clock signal line 145 such that only an even number of second inverters 142 are on the second voltage clock signal line 145 between the second voltage clock signal generator 140 and any given multi-level current driver 120 to buffer transmission of the second voltage clock signal ($CLK_2$) to that multi-level current drivers 120 (i.e., to avoid signal degradation of the second voltage clock signal between the second voltage clock signal generator 140 and each of the multi-level current drivers 120). Additionally, a capacitor 151 can be electrically connected in series between the voltage reference line 155 and the power supply 190 in order to prevent noise from altering the voltage reference (Vref) on the voltage reference line 155.

The details of the nano-magnetic element array described above are directed to information propagation operations (i.e., erase, switch and store) and not to read (i.e., sense) operations. Those skilled in the art will recognize that additional circuitry (e.g., magnetic tunnel junctions (MJTs) could also be incorporated into the nano-magnetic element array to perform read operations (i.e., to acquire output from the magnetic to the electrical domain). Such circuitry is known in the art and, thus, the details are omitted from this specification in order to allow the reader to focus on the salient aspects of the disclosed arrays.

It should be understood that the terminology used herein is for the purpose of describing particular embodiments only and is not intended to be limiting of this disclosure. For example, as used herein, the singular forms "a", "an" and "the" are intended to include the plural forms as well, unless the context clearly indicates otherwise. Additionally, the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It should further be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention as set forth above have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are improved nano-magnetic element arrays (e.g., magneto-resistive random access memory (MRAM) arrays or logic arrays) that allow for greater speed and functionality. In each nano-magnetic element array, a conductive line can be positioned adjacent to a group of nano-magnetic elements and a multi-level current driver can be electrically connected to an input node on the conductive line. The multi-level current driver can receive a pair of voltage clock signals and at least one voltage reference and based thereon, can selectively change the amount of current applied at the input node between multiple different levels. For example, the multi-level current driver can selective change the amount of current applied at the input node between a first level that erases the state of the elements, a second level that is less than the first level and that switches the state of the elements and a third or zero level that maintains the state of the elements. The multi-level current driver can further be configured so that the transition from the second level to the third level is gradual to prevent soft errors. The same pair of voltage clock signal lines and the same voltage reference line can be used supply signals to other multi-level current drivers in the array. Optionally, the voltage reference can be supplied by a bias generator that is configured to allow the voltage reference and, thereby the amount of current flowing to the input node at the first and second levels to be selectively adjusted.

What is claimed is:

1. A nano-magnetic element array comprising:
   a first voltage clock signal line;
   a second voltage clock signal line;
   a voltage reference line;
   a first group of nano-magnetic elements;
   a conductive line comprising:
      at least a first segment adjacent to said first group; and
      an input node at one end of said first segment; and
   a multi-level current driver electrically connected to said input node, said first voltage clock signal line, said second voltage clock signal line and said voltage reference line,
   said multi-level current driver receiving a first voltage clock signal on said first voltage clock signal line, a second voltage clock signal on said second voltage clock signal line and a voltage reference on said voltage reference line and, based on said first voltage clock signal, said second voltage clock signal and said voltage reference, selectively changing an amount of current applied at said input node between multiple different levels, said nano-magnetic elements being responsive to said multiple different levels.

2. The nano-magnetic element array of claim 1, said multiple different levels comprising a first level, a second level and a third level,
   said first level erasing a state of said nano-magnetic elements,
   said second level being less that said first level and switching said state of said nano-magnetic elements, and
   said third level being approximately zero so as to maintain said state of said nano-magnetic elements.

3. The nano-magnetic element array of claim 2, further comprising first inverters buffering said first voltage clock signal in said first voltage clock signal line and second inverters buffering said second voltage clock signal in said second voltage clock signal line.

4. The nano-magnetic element array of claim 3, said multi-level current driver comprising:

a first transistor connected to a power supply and having a first gate controlled by said voltage reference;
a second transistor connected to said power supply and having a second gate controlled by said voltage reference;
a third transistor connected in series between said first transistor and said input node, said third transistor having a third gate controlled by said first voltage clock signal; and
a fourth transistor connected in series between said second transistor and said input node, said fourth transistor having a fourth gate controlled by said second voltage clock signal,
said first level being achieved when said first voltage clock signal and said second voltage clock signal are such that said third transistor and said fourth transistor are both on,
said second level being achieved when said first voltage clock signal is such that said third transistor is off and said second voltage clock signal is such that said fourth transistor is on, and
said third level being achieved when said first voltage clock signal and said second voltage clock signal are such that said third transistor and said fourth transistor are both off.

5. The nano-magnetic element array of claim 4, said first transistor being larger than said second transistor such that a first current from said first transistor and gated by said third transistor is greater than a second current from said second transistor and gated by said fourth transistor.

6. The nano-magnetic element array of claim 4, said multi-level current driver further comprising: a fifth transistor electrically connected in series between said power supply and a second inverter that is on said second voltage clock signal line and that outputs said second voltage clock signal directly to said multi-level current driver, said fifth transistor comprising a fifth gate controlled by said voltage reference and ensuring that a transition between said second level and said third level is gradual.

7. The nano-magnetic element array of claim 1, further comprising a second group of nano-magnetic elements, said conductive line comprising a second segment adjacent to said second group and connected to said input node.

8. A nano-magnetic element array comprising:
a first voltage clock signal line;
a second voltage clock signal line;
a voltage reference line;
a bias generator generating a voltage reference on said voltage reference line;
a first group of nano-magnetic elements;
a conductive line comprising:
    at least a first segment adjacent to said first group; and
    an input node at one end of said first segment; and
a multi-level current driver connected to said input node, said first voltage clock signal line, said second voltage clock signal line and said voltage reference line;
said multi-level current driver receiving a first voltage clock signal on said first voltage clock signal line, a second voltage clock signal on said second voltage clock signal line and said voltage reference on said voltage reference line and, based on said first voltage clock signal, said second voltage clock signal and said voltage reference, selectively changing an amount of current applied at said input node between multiple different levels, said nano-magnetic elements being responsive to said multiple different levels.

9. The nano-magnetic element array of claim 8, said multiple different levels comprising a first level, a second level and a third level,
said first level erasing a state of said nano-magnetic elements,
said second level being less that said first level and switching said state of said nano-magnetic elements, and
said third level being approximately zero so as to maintain said state of said nano-magnetic elements.

10. The nano-magnetic element array of claim 9, further comprising first inverters buffering said first voltage clock signal in said first voltage clock signal line and second inverters buffering said second voltage clock signal in said second voltage clock signal line.

11. The nano-magnetic element array of claim 10, said multi-level current driver comprising:
a first transistor connected to a power supply and having a first gate controlled by said voltage reference;
a second transistor connected to said power supply and having a second gate controlled by said voltage reference;
a third transistor connected in series between said first transistor and said input node, said third transistor having a third gate controlled by said first voltage clock signal; and
a fourth transistor connected in series between said second transistor and said input node, said fourth transistor having a fourth gate controlled by said second voltage clock signal,
said first level being achieved when said first voltage clock signal and said second voltage clock signal are such that said third transistor and said fourth transistor are both on,
said second level being achieved when said first voltage clock signal is such that said third transistor is off and said second voltage clock signal is such that said fourth transistor is on, and
said third level being achieved when said first voltage clock signal and said second voltage clock signal are such that said third transistor and said fourth transistor are both off.

12. The nano-magnetic element array of claim 11, said first transistor being larger than said second transistor such that a first current from said first transistor and gated by said third transistor is greater than a second current from said second transistor and gated by said fourth transistor.

13. The nano-magnetic element array of claim 11, said multi-level current driver further comprising: a fifth transistor electrically connected in series between said power supply and a second inverter that is on said second voltage clock signal line and that outputs said second voltage clock signal directly to said multi-level current driver, said fifth transistor comprising a fifth gate controlled by said voltage reference and ensuring that a transition between said second level and said third level is gradual.

14. The nano-magnetic element array of claim 8, said bias generator comprising:
a fixed current voltage reference line receiving a fixed current voltage reference;
a first type conductivity field effect transistor having a gate controlled by said voltage reference line; and
a plurality of second type conductivity field effect transistors having gates controlled by said fixed current voltage reference,
said second type conductivity field effect transistors being electrically connected in parallel to said voltage reference line, said second type conductivity field effect transistors each being electrically connected in series to a first power supply by corresponding switches, said first type conductivity field effect transistor further being electrically connected in series between a second power supply and said voltage reference line, and said corresponding switches being individually selectable to adjust said voltage reference on said voltage reference line and, thereby to adjust said amount of said current.

15. The nano-magnetic element array of claim 8, further comprising a second group of nano-magnetic elements, said conductive line comprising a second segment adjacent to said second group and connected to said input node.

16. A nano-magnetic element array comprising:
a first voltage clock signal line;
a second voltage clock signal line;
a voltage reference line; and
a plurality of sections, each section comprising:
    a first group of nano-magnetic elements;
    a conductive line comprising:
        at least a first segment adjacent to said first group; and
        an input node at one end of said first segment; and
    a multi-level current driver connected to said input node, said first voltage clock signal line, said second voltage clock signal line and said voltage reference line,
said multi-level current driver receiving said first voltage clock signal on said first voltage clock signal line, said second voltage clock signal on said second voltage clock signal line and said voltage reference on said voltage reference line and, based on said first voltage clock signal, said second voltage clock signal and said voltage reference, selectively changing an amount of current applied at said input node between multiple different levels, said nano-magnetic elements being responsive to said multiple different levels.

17. The nano-magnetic element array of claim 16, said multiple different levels comprising a first level, a second level and a third level,
said first level erasing a state of said nano-magnetic elements,
said second level being less that said first level and switching said state of said nano-magnetic elements, and
said third level being approximately zero so as to maintain said state of said nano-magnetic elements.

18. The nano-magnetic element array of claim 17, further comprising, adjacent to each of said multi-level current drivers, first inverters buffering said first voltage clock signal in said first voltage clock signal line and second inverters buffering said second voltage clock signal in said second voltage clock signal line.

19. The nano-magnetic element array of claim 18, each of said multi-level current driver comprising:
a first transistor connected to a power supply and having a first gate controlled by said voltage reference;
a second transistor connected to said power supply and having a second gate controlled by said voltage reference;
a third transistor connected in series between said first transistor and said input node, said third transistor having a third gate controlled by said first voltage clock signal;
a fourth transistor connected in series between said second transistor and said input node, said fourth transistor having a fourth gate controlled by said second voltage clock signal,
said first level being achieved when said first voltage clock signal and said second voltage clock signal are such that said third transistor and said fourth transistor are both on,
said second level being achieved when said first voltage clock signal is such that said third transistor is off and said second voltage clock signal is such that said fourth transistor is on, and
said third level being achieved when said first voltage clock signal and said second voltage clock signal are such that said third transistor and said fourth transistor are both off; and
a fifth transistor electrically connected in series between said power supply and a second inverter that is on said second voltage clock signal line and that outputs said second voltage clock signal directly to said multi-level current driver, said fifth transistor comprising a fifth gate controlled by said voltage reference and ensuring that a transition between said second level and said third level is gradual.

20. The nano-magnetic element array of claim 16, further comprising a bias generator generating said voltage reference on said voltage reference line, said bias generator comprising:
a fixed current voltage reference line receiving a fixed current voltage reference;
a first type conductivity field effect transistor having a gate controlled by said voltage reference line; and
a plurality of second type conductivity field effect transistors having gates controlled by said fixed current voltage reference,
said second type conductivity field effect transistors being electrically connected in parallel to said voltage reference line,
said second type conductivity field effect transistors each being electrically connected in series to a first power supply by corresponding switches,
said first type conductivity field effect transistor further being electrically connected in series between a second power supply and said voltage reference line, and
said corresponding switches being individually selectable to adjust said voltage reference on said voltage reference line and, thereby to adjust said amount of current.

* * * * *